United States Patent [19]
Söderbärg

[11] Patent Number: 6,015,982
[45] Date of Patent: Jan. 18, 2000

[54] LATERAL BIPOLAR FIELD EFFECT MODE HYBRID TRANSISTOR AND METHOD FOR OPERATING THE SAME

[75] Inventor: Anders Söderbärg, Uppsala, Sweden

[73] Assignee: Telefonaktiebolaget LM Ericsson, Stockholm, Sweden

[21] Appl. No.: 08/968,213

[22] Filed: Nov. 12, 1997

[30] Foreign Application Priority Data

Nov. 13, 1996 [SE] Sweden .................................. 9604142

[51] Int. Cl.[7] ........................ H01L 29/772; H01L 27/085
[52] U.S. Cl. .......................... 257/262; 257/273; 257/350; 257/378; 257/564
[58] Field of Search ................................... 257/273, 262, 257/350, 378, 563, 564

[56] References Cited

U.S. PATENT DOCUMENTS

| | | | |
|---|---|---|---|
| 4,139,781 | 2/1979 | Fulkerson | 257/563 |
| 4,292,642 | 9/1981 | Appels . | |
| 4,409,606 | 10/1983 | Wagenaar et al. . | |
| 4,642,666 | 2/1987 | Lidow et al. . | |
| 4,823,173 | 4/1989 | Beasom . | |
| 4,857,772 | 8/1989 | Herndon . | |
| 4,982,262 | 1/1991 | Hartman | 257/563 |
| 5,264,719 | 11/1993 | Beasom . | |
| 5,338,961 | 8/1994 | Lidow et al. . | |
| 5,359,220 | 10/1994 | Larson et al. . | |
| 5,659,190 | 8/1997 | Litwin | 257/273 |

FOREIGN PATENT DOCUMENTS

| | | |
|---|---|---|
| 0251682A2 | 1/1988 | European Pat. Off. . |
| 0623951A1 | 11/1994 | European Pat. Off. . |
| 2-69943 | 3/1990 | Japan . |

OTHER PUBLICATIONS

Bengt Edholm, et al., "Very High Current Gain Enhancement by Substrate Biasing of Lateral Bipolar Transistors on Thin SOI", Microelectronic Engineering, vol. 22, 1993, pp. 379–382.

Anders Söderbärg, et al., "High Current Gain Hybrid Lateral Bipolar Operation of DMOS Transistors", IEEE Transaction on Electron Devices, vol. 42, No. 9, Sep. 1995, pp. 1628–1635.

Torkel Arnborg, et al., "Analysis of New High–Voltage Bipolar Silicon–on–Insulator Transistor with Fully Depleted Collector", IEEE Transactions on Electron Devices, vol. 42, No. 1, Jan. 1995, pp. 172–177.

*Primary Examiner*—Jerome Jackson, Jr.
*Attorney, Agent, or Firm*—Burns, Doane, Swecker & Mathis, L.L.P.

[57] ABSTRACT

The invention relates to a semiconductor device and a method in this device, wherein the semiconductor device operates completely or partly in lateral extension. The semiconductor device comprises at least two high-voltage lateral bipolar transistors with at least two mutually opposite emitter/base regions, which are placed at the surface of the epi-taxial layer at a mutual distance such that an intermediate common collector region is formed. The common collector region can be completely depleted when the device has a voltage applied and by using a lateral depletion of said collector region, the voltage durability of the semiconductor device can be determined lithographically by the distance between the doped regions comprised in the device. Furthermore, undesired parasitic components, which are dependent on the quality of the active layer of the device, resistivity and substrate potential, can be eliminated or suppressed.

9 Claims, 10 Drawing Sheets

Fig. 5a (section A-A)

Fig. 5b (section B-B)

Fig. 5c (section C-C)

ND METHOD FOR
LATERAL BIPOLAR FIELD EFFECT MODE HYBRID TRANSISTOR AND METHOD FOR OPERATING THE SAME

TECHNICAL FIELD

The present invention relates to a semiconductor device and a method for this device.

STATE OF THE ART

To implement a high-voltage bipolar transistor, a technique is today used based on the transistor, which is placed in an epitaxial layer, so-called epi-layer, operating in vertical mode. In other words, the depletion of the collector of the transistor occurs vertically down towards a buried oxide, isolating the transistor from a semiconductor substrate, so-called Silicon-On-Insulator (SOI). This method is described in the European patent application with publication number EP 0 623 951 A1 and in an article in IEEE Transactions on Electronic Devices, Vol. 42, No. 1 from January 1995 by Torkel Arnborg and Andrej Litwin with the title "Analysis of New High--Voltage Bipolar Silicon-On-Insulator Transistor with Fully Depleted Collector". According to EP 0 623 951 A1 the bipolar transistor also has a JFET connected in series, operating in lateral extension. A great advantage of this method is the area gain which theoretically can be achieved compared to a conventional bipolar transistor. The area of the collector to be depleted extends from the transistor base collector junction down to the buried oxide. In practice, it has been shown that this depletion occurs at a voltage which is strongly dependent on things like the substrate potential, the doping of the epi-layer and especially the thickness of the epi-layer. If a transistor is fabricated with a generous safety margin, this means that the great area gain can be lost.

The patent documents U.S. Pat. Nos. 4,642,666 and 5,338,961 describe a MOSFET operating laterally and having similar properties to a bipolar transistor, e.g. a low on-resistance, and which can be used instead of a bipolar circuit where a high breakthrough voltage is desired. The MOSFET has two source areas with a common gate and a drain area. When a suitable voltage is applied to the gate, two channels arc formed below the gate from the source area to a central area. A current can then flow from the source area via one of the channels to the drain area.

The patent documents U.S. Pat. Nos. 5,264,719 and 4,823,173 describe a technique for improving the lateral drift region both for bipolar and MOS-circuits, where an increase in breakthrough voltage and a decrease in on-resistance are desired. This is achieved by placing a gate, doped with the same doping substance as the drift region, over the lateral drift region.

The patent documents U.S. Pat. Nos. 4,409,606 and 4,292,642 describe different methods for increasing the breakthrough voltage for a semiconductor and at the same time avoiding a lateral current concentration (the Kirk-effect). By making the drift region thin and with a low doping concentration, a lower voltage is required to deplete the drift region compared to what is required for a breakthrough.

In the journal Microelectronic Engineering 22 (1993) pages 379–382 with the title "Very High Current Gain Enhancement by Substrate Biasing of Lateral Bipolar Transistors on Thin SOI" by Bengt Edholm, Jörgen Olsson and Anders Söderbärg (Uppsala University) a method is described for increasing the gain of lateral bipolar transistors by biasing the substrate which leads to altered charge conditions in the base.

In the journal IEEE Transactions on Electron Devices, Vol. 42, No. 9, September 1995, pages 1628–1634 with the title "High Current Gain Hybrid Lateral Bipolar Operation of DMOS Transistors" by Jörgen Olsson, Bengt Edholm, Anders Söderbärg and Kjell Bohlin is described, among other things, how a hybrid function can be achieved for a conventional DMOS.

DESCRIPTION OF THE INVENTION

The problem of a high-voltage vertical transistor is that a relatively thick buried oxide layer is needed, about 3 $\mu$m, below an active epi-layer to suppress the dependence on substrate potential. This results in problems with heat diversion from the transistor in the epi-taxial layer. A very high accuracy is further required regarding the epi-layer's thickness and resistivity, depending on the doping of the epi-layer. Further, it is hard to find manufacturers fulfilling the requirements above regarding accuracy. The present invention relates to the above problems.

A further problem is to achieve a predetermined high gain in connection with voltage durability and external control of the gain of a bipolar component.

A not previously addressed new problem is how to make a semiconductor device which can be set up to work in two different modes, such as different components of conventional type, e.g. from a lateral bipolar transistor to a MOS.

The object of the present invention is to replace the previous, briefly described, vertical bipolar transistor with a lateral bipolar transistor.

A further object is to make the lateral bipolar transistor operate with a predetermined high gain in connection with voltage durability and a possibility to change the operating mode of the transistor.

The problem of manufacturing a high voltage transistor without a thick buried oxide is solved by using two opposite emitter/base regions, which are placed by the epitaxial layer surface at such a distance from each other that an intermediate common collector region can be completely depleted.

At a given voltage depletion occurs, but unlike the vertical transistor this occurs laterally and the voltage that the transistor can withstand is determined lithographically by the distance between the doped regions comprised in the component, e.g. base/emitter connection and drain connection.

The main advantages of the invention is that the depletion voltage is not dependent on the substrate potential, the doping of the epi-layer or of the epi thickness. This means that a cheaper SOI-substrate with a thinner oxide can be used.

A further advantage is that the gain in area that a vertical bipolar transistor theoretically achieves can be implemented in practice with a lateral bipolar transistor.

A further advantage of the component is that the lateral bipolar transistor can operate with a predetermined high gain in connection with voltage durability and with a possibility of changing the operating mode of the transistor.

Yet another advantage is that the component is relatively simple to implement as a number of cells in parallel to thereby achieve a desired output load capacity.

The invention will now be further described using preferred embodiments and with reference to the annexed drawings.

PREFERRED EMBODIMENTS

Figure 1:
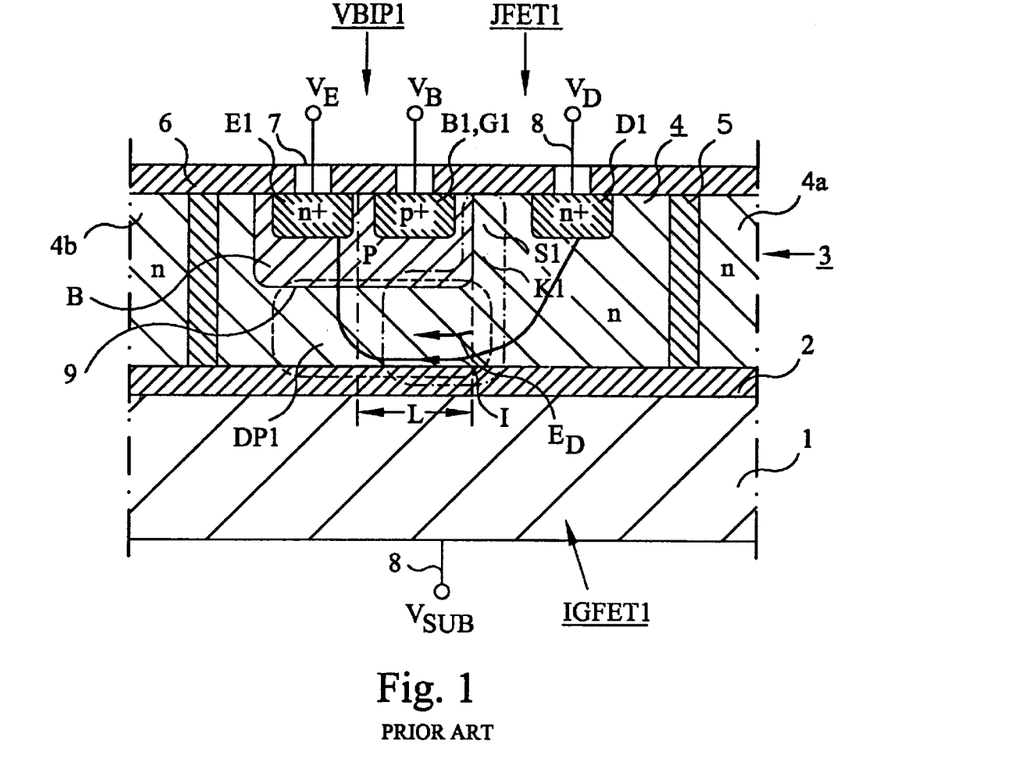
FIG. 1 shows a cross-section through a vertical bipolar transistor (VBIP1) and two field effect transistors (JFET1, IGFET1) according to the state of the art.

FIG. 1 shows a cross-section of a vertical bipolar NPN-transistor VBIP1 connected in series with two field effect transistors JFET1 and IGFET1 in parallel according to the state of the art. A semiconductor substrate 1, e.g. silicon, has its upper surface oxidized to an electrically isolating layer 2 of silicon dioxide. Mounted on top of the layer 2 is a relatively thin disc 3 of single-crystal silicon, which is the active layer for the transistor device VBIP1, JFET1 and IGFET1. This active layer has a relatively low concentration of negative carriers, which in the figure has been denoted n. Within the single-crystal disc 3 a component region 4 is delimited from the surrounding parts 4a and 4b by a separation layer 5, which can be obtained from e.g. silicon dioxide or a reversed biased PN-junction. The separation layer 5 extends from the surface of the single-crystal disc 3 down to the isolating layer 2 and surrounds completely the transistors VBIP1, JFET1 and IGFET1. The component region 4 is hereby completely electrically isolated from the substrate 1 and the surrounding parts 4a and 4b of the single-crystal disc 3.

The transistor VBIP1 has a base region B doped with positive carriers which is denoted p in the figure. The base B has a connection region B1 for an external electrical connection and said connection region is heavily p+ doped with positive carriers The transistor VBIP1 has in the base region B an emitter E1 which is heavily n+ doped with negative carriers. In the component region 4 the transistor VBIP1 also comprises a collector region K1. The transistor JFET1 has a gate connection G 1 common with the base connection B 1 and its source connection S1 is common with the collector region K1 of the transistor VBIP1. A heavily n+ doped region D1 con-stitutes the drain connection of the transistor JFET1. The transistor IGFET1 is con-nected to the drain connection D1 and the source connection S1 such that it is in parallel with the transistor JFET1 and such that these are cascade connected with the vertical bipolar transistor VBIP1. A gate connection of the transistor IGFET1 is the semiconductor substrate 1.

The component region 4 is covered by an isolating layer 6, e.g. silicon dioxide, which comprises openings 7 for external electrical connections 8. These are connected with the base connector region B1, the emitter E1 and the drain region D1, respectively. The semiconductor substrate 1 is furthermore connected to an external electrical connection 8. The design of these external electrical connections is well known and the connections are not shown in detail in FIG. 1 in order not to make the figure unnecessarily complicated.

Figure 2:
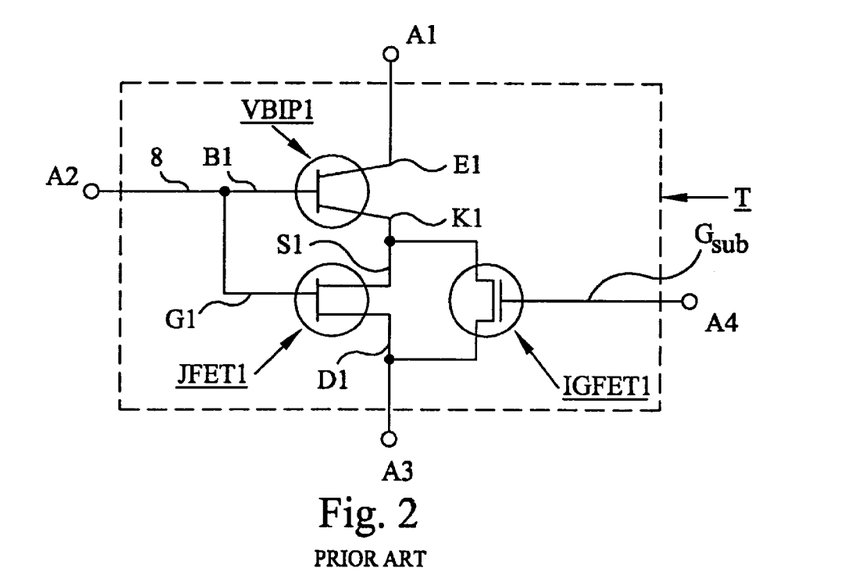
FIG. 2 shows a diagram with the transistors of FIG. 1.

FIG. 2 schematically shows the field effect transistors JFET1 and IGFET1 in parallel, which are cascade-connected with the vertical bipolar NPN-transistor. The base connection B1 is connected to the gate connection G1 of the transistor JFET1, and the collector K1 is connected to the source region S1, and the gate connection Gsub of the transistor IGFET1 is connected to the semiconductor substrate 1. The base connection B1, the emitter E1, the drain connection D1 and the semiconductor substrate 1 each have an external connection 8. The components described above can be considered a parasitic group T with connections A1–A4 to the suggested invention, see FIG. 4.

The transistor VBIP1 in FIGS. 1 and 2 has a PN-junction 9 at the lower surface of the base region B, which can be reverse-biased and depleted of carriers by connecting the voltages $V_D$, $V_E$, $V_B$, $V_{sub}$ to the external connections 8. A region DP1, between the PN-junction 9 and the isolating layer 2, has a relatively low doping level, and the region also has a relatively small thickness. The whole region DP1 is therefore depleted of carriers, and a large part of the voltage between the base region B and the drain region D1 is divided over a relatively long distance L. Hereby an electrical field strength $E_D$ in the depletion region DP1 assumes a low value, compare resurf technique. The field strength in the region can be kept below the critical field strength $E_{CR}$ of the silicon, which is about $3–10^5$ V/cm, and current avalanche of a current I in this region can be prevented.

The region DP1 is depleted of carriers at a drain voltage $V_D$ of only a few Volts. The distribution of the electric field strength in the component region is influenced by the semiconductor substrate's 1 potential $V_{sub}$, which can cause an avalanche breakthrough at the drain connection at too low a potential or an avalanche breakthrough between the emitter and the collector at too high a potential.

Figure 3:
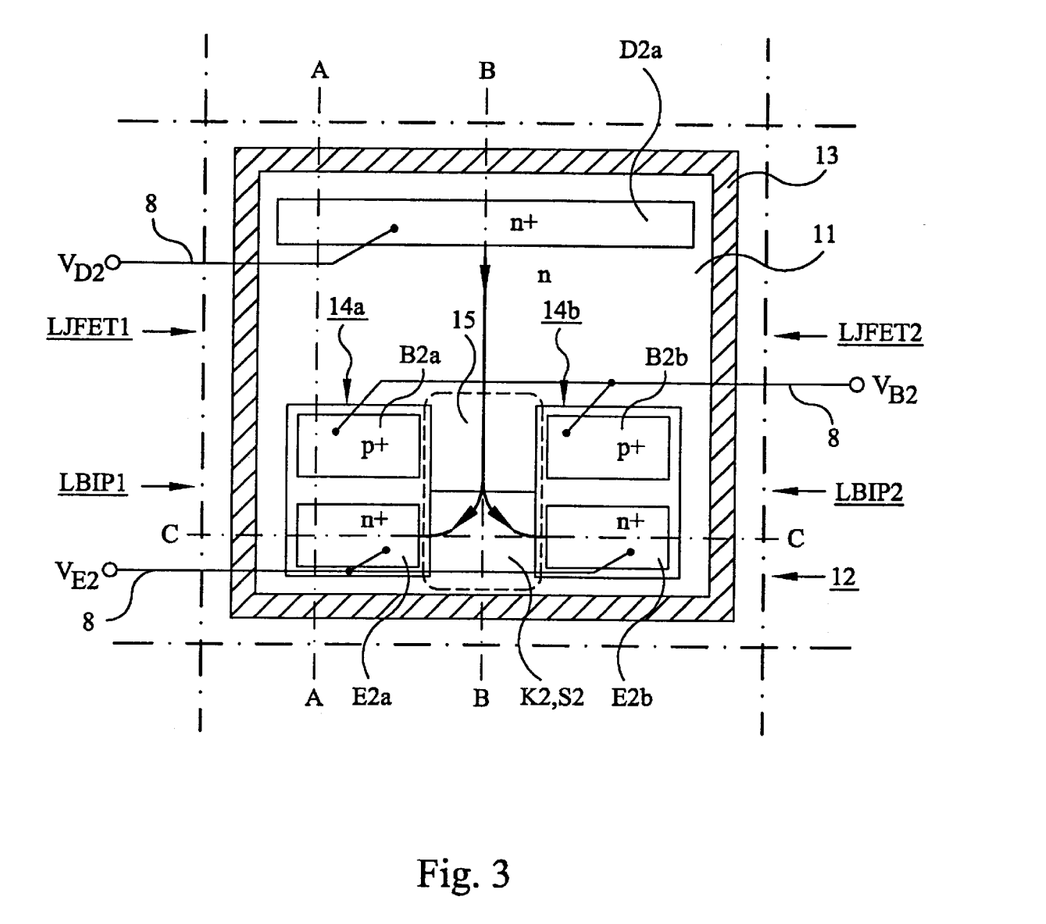
FIG. 3 shows a top view of a component region according to the invention with two lateral bipolar transistors (LBIP1, LBIP2), two lateral field effect transistors (LJFET1, LJFET2) and two parasitic circuits comprising a vertical bipolar transistor (VBIP2) and two field effect transistors (VJFET2, IGFET2).

FIG. 3 shows a top view of a semiconductor device according to the invention, comprising a component region 11 with two lateral bipolar NPN-transistors LBIP1 and LBIP2 in parallel, and two lateral field effect transistors LJFET1 and LJFET2 in parallel. Two parasitic circuits comprising a vertical bipolar NPN-transistor VBIP2 and two field effect transistors VJFET2 and IGFET2 also arise in the device. It is to be noted that only the transistors LBIP1, LBIP2, LJFET1 and LJFET2 are shown in FIG. 3. The remaining components arc shown below in FIG. 5a. The component region 11 is arranged in a single-crystal disc 12, wherein the component region is delimited from the surrounding parts by a separation layer 13, which according to the example is provided as e.g. a silicon dioxide layer. According to an alternative the separation layer is provided as a reverse-biased PN-junction.

The transistors LJFET1 and LJFET2 have a drain region D2a which is heavily doped with negative carriers, which are denoted n+ in the figure. One of the bipolar transistors LBIP1 further has a first base region 14a and the second bipolar transistor LBIP2 has a second base region 14b separated from the first, where each base region 14a,14b has a base connection region B2a and B2b, respectively, for an external connection 8, and each connection region is heavily p+ doped with positive carriers. The transistors LBIP1 and LBIP2 each have in the base region 14a,14b an emitter E2a and E2b, respectively, which is heavily n+ doped with negative carriers. In each base region 14a,14b the emitter E2a,E2b is arranged at the base connection region B2a,B2b, and the base regions 14a,14b are placed side by side in the component region 11 such that none of the base connection regions B2a, B2b or the drain region D2a is arranged between the emitters E2a, E2b of the respective base regions. The drain region D2a is arranged at one side of the base regions 14a and 14b such that the base connection region B2a and B2b in each base region, respectively, is arranged between the base region's respective emitter E2a, E2b and drain region D2a.

The base connections B2a, B2b and the emitters E2a, E2b are each interconnected and connected to a respective external connection 8. The drain connection D2a is also connected to an external connection 8. The distance between the base regions 14a and 14b is big enough to create a lightly n-doped common collector region 15, but not greater than that the common collector region can be fully depleted when voltages $V_{D2}$, $V_{B2}$, $V_{E2}$ are applied to the external connections 8.

Figure 4:
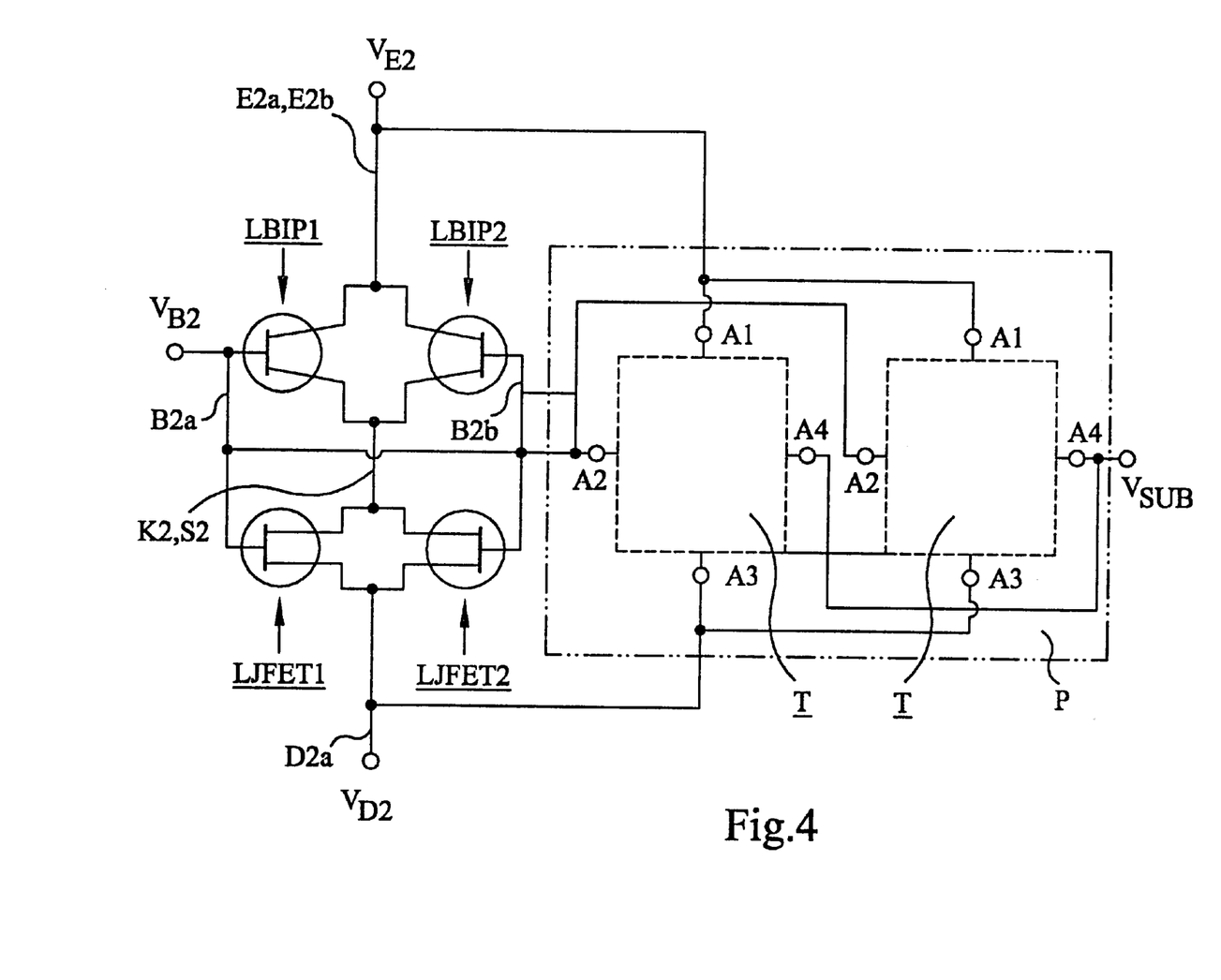
FIG. 4 shows an equivalent somewhat simplified schematic of the transistors in FIG. 3.

FIG. 4 shows schematically the lateral bipolar transistors LBIP1 and LBIP2 in parallel and the lateral field effect transistors LJFET1 and LJFET2 in parallel, the common collector region K2 of the bipolar transistors coinciding with the common source region S2 of the field effect transistors, and furthermore the gate and base connections of all the transistors are interconnected. In parallel with the lateral transistors LBIP1, LBIP2, LJFET1 and LJFET2 there are a number of parasitic components P connected. These comprise two parasitic groups T, interconnected according to FIG. 2, all the groups being connected such that each group's emitter A1, base connection A2 and drain connection A3 are interconnected with the respective emitter E2a, E2b, base connection B2a, B2b and drain connection D2a of the lateral transistors. Furthermore, the substrate connection A4 of each group is connected to a semiconductor substrate 16. The base connection B2a, B2b, the emitter E2a, E2b, the drain connection D2a and the semiconductor substrate 16 each have an external connection 8.

Figure 5A:
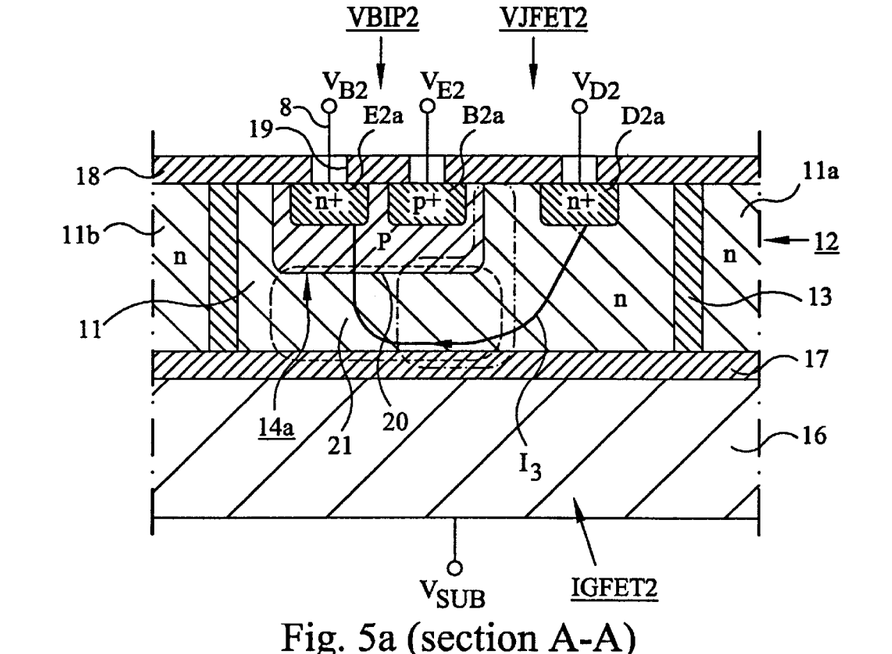
FIGS. 5a–5c show different cross-sections of the structure in FIG. 3.
Figure 5B:
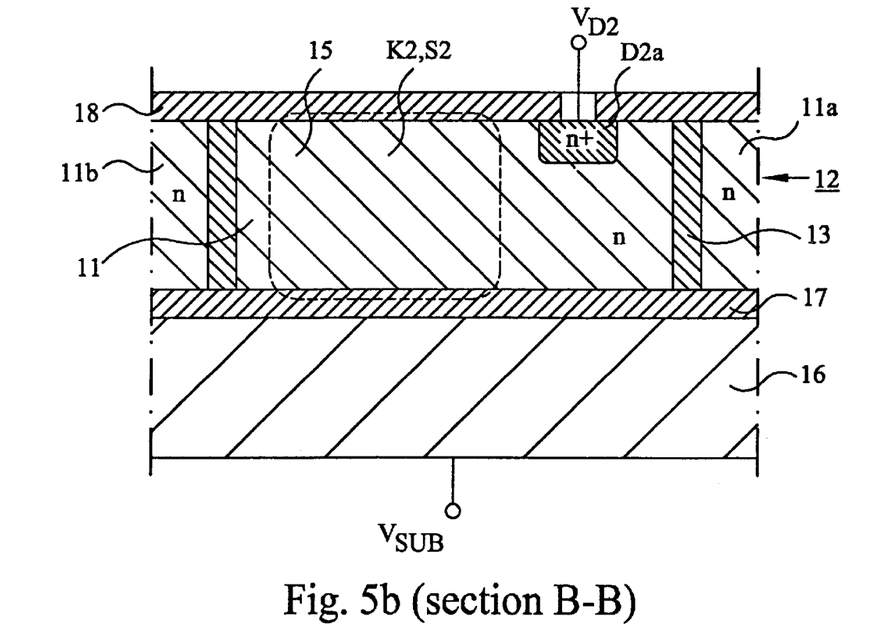
Figure 5C:
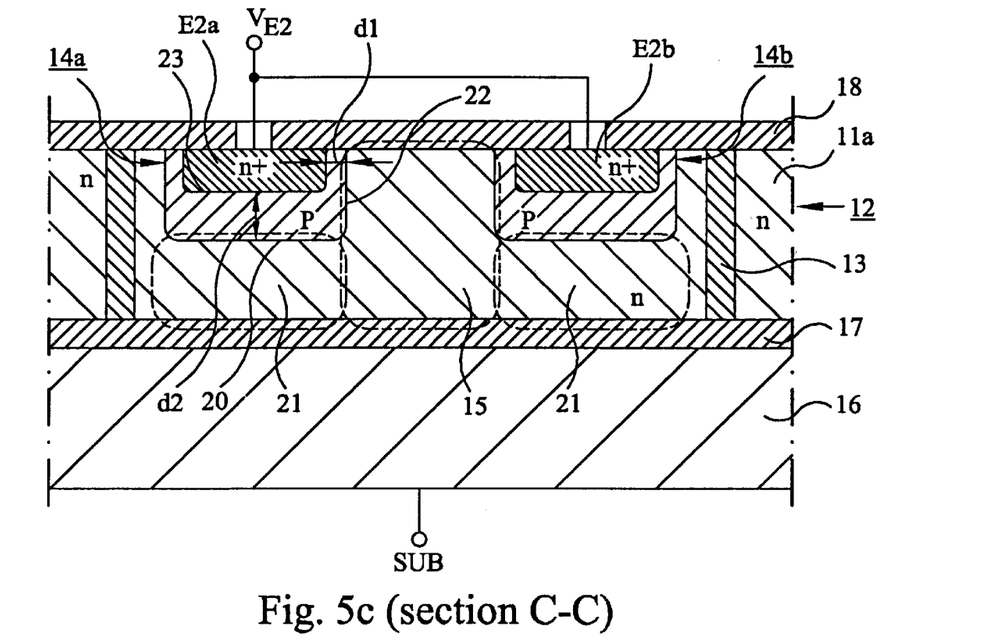

FIGS. 5a–5c show different cross-sections from FIG. 3 illustrating a semiconductor body comprising the semiconductor substrate 16, a dielectrically isolating layer 17 and the relatively thin disc 12 of single-crystal silicon. The semiconductor substrate 16 of e.g. silicon has its upper surface oxidized to the electrically isolating layer 17 of silicon dioxide. Mounted on top of the layer 17 is the single-crystal disc 12 of silicon, which constitutes the active layer for the transistor device LBIP1, LBIP2, LJET1, LJFET2, VBIP2, VJFET2 and IGFET2. This active layer has a relatively low concentration of negative carriers, which in the figure has been denoted n. In the single-crystal disc 12, the component region 11 is delimited from surrounding parts 11a and 11b by the separation layer 13. The separation layer 13 extends from the surface of the single-crystal disc 12 down to the isolating layer 17 and completely surrounds the transistors LBIP1, LBIP2, LJFET1, LJFET2, VBIP2, VJFET2 and IGFBT2. The component region 11 is hereby completely electrically isolated from the substrate 16 and the surrounding parts 11a and 11b of the single-crystal disc 12.

FIG. 5a shows a first cross-section through one of the two base regions 14a of the lateral transistor LBIP1, section A—A in FIG. 3. The base region 14a is doped with positive carriers, denoted p in the figure. The base region 14a has, as mentioned before, a connection region B2a for an external electrical connection, and this region is heavily p+ doped with positive carriers. The transistor LBIP1 has in the base region 14a the emitter E2a which is heavily n+ doped with negative carriers. In the component region 11 the lateral field effect transistor LJFET1 has the drain region D2a, and the base connection B2a of the lateral bipolar transistor works as a gate connection to the field effect transistor LBFET1. The remaining transistors VBIP2, VJFET2 and IGFET2 comprise a transistor circuit according to FIG. 1.

The component region 11 is covered by an isolating layer 18 of e.g. silicon dioxide, which is provided with openings 19 for external electrical connections 8. These are connected to the base connection region B2a and B2b, respectively, the emitter E2a, E2b, and the drain region D2a. The semiconductor substrate 16 is furthermore connected to an external electrical connection 8.

The transistor VBIP2 in FIG. 5a has a PN-junction 20 at the lower surface of the base region 14a, which can be reverse-biased and depleted of carriers by application of voltages $V_{D2}$, $V_{E2}$, $V_{B2}$ and $V_{sub}$ to the external connections 8. A region 21 between the PN-junction 20 and the isolating layer 17 has a relatively low doping level, and the region also has a relatively small thickness. The whole region 21 is therefore depleted of carriers. Compare prior art in FIG. 1.

FIG. 5b shows a second cross-section through the common collector region 15 between the base regions 14a and 14b of the lateral transistors, section B—B in FIG. 3. The common collector region 15 between the base regions 14a and 14b is depleted at a positive difference in potential between the drain connection D2a and the base connections B2a and B2b. In the common collector region the collectors K2 of the lateral bipolar transistors LBIP1 and LBIP2 coincide with the sources S2 of the lateral field effect transistors LJFET1 and LJFET2.

FIG. 5c shows a third cross section through the two base regions 14a and 14b and the emitter E2a and E2b of each base region, section C—C in FIG. 3. Between the base regions there is the common collector region 15, and below each base region there is the depletion region 21 as described previously in FIGS. 5a and 5b. The regions are depleted when voltages are applied to the external electrical connections. An important detail when dimensioning the base region 14a with its emitter region E2a is that a charge integrated over a shortest distance d1 between the emitter and the limiting surface 22 of the base region towards the common collector region is smaller than a charge integrated over a shortest distance d2 between the emitter and the lower surface 20 of the base region. The value of this integrated charge is called gummel number? and a low gummel number means a high gain of a bipolar component. The lateral gummel number $G_{lat}$ over the distance d1 is thus supposed to be less than the vertical gummel number $G_{vert}$ over the distance d2.

The lower surface 20 of the base region may, without altering the function of the semiconductor device, coincide with the isolating layer 17, which means that the depletion region 21 below each base region 14a and 14b is eliminated. Another alternative is that a distance between the lower surface 20 of the base region and the isolating layer 17 is far enough so that the region therebetween cannot be depicted, i.e. the depletion region 21 does not extend all the way down to the isolating layer 17. For this to be possible, the region between the base and the isolating layer must be lightly doped enough so that a premature avalanche breakthrough in this region does not deteriorate the voltage durability of the component.

Figure 6:
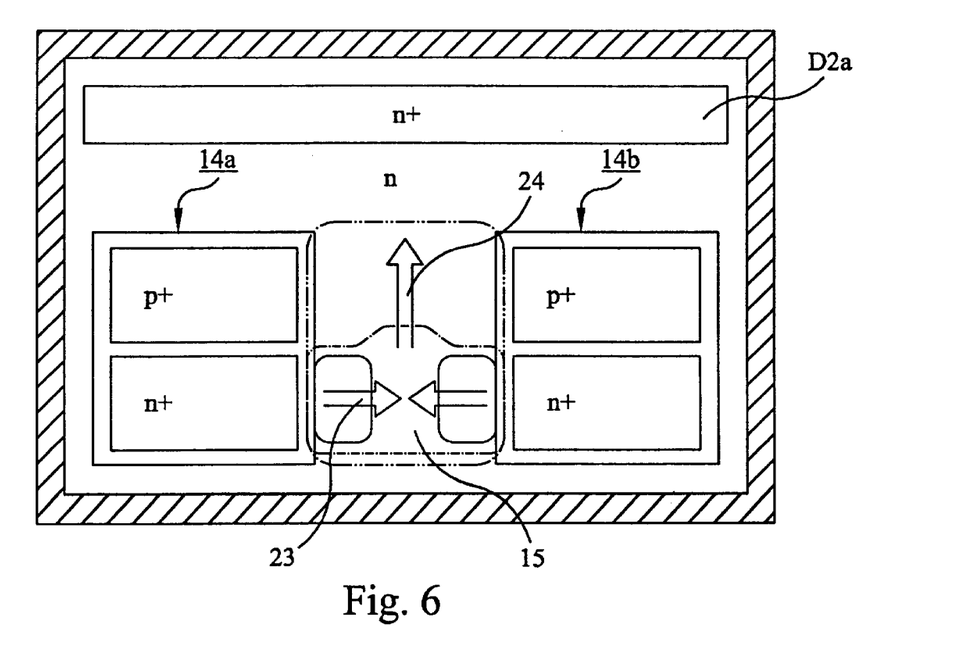
FIG. 6 shows a view of a depletion region extension between the base regions of a lateral bipolar transistor according to FIG. 3.

FIG. 6 shows a lateral propagation of the depletion region between the base regions 14a and 14b of the lateral transistors, the propagation being shown in two steps. Propagation occurs in a first step 23 in a direction from each base region into the common collector region 15. In a second step 24 propagation occurs in a lateral transverse direction toward the drain connection D2a.

Figure 7:
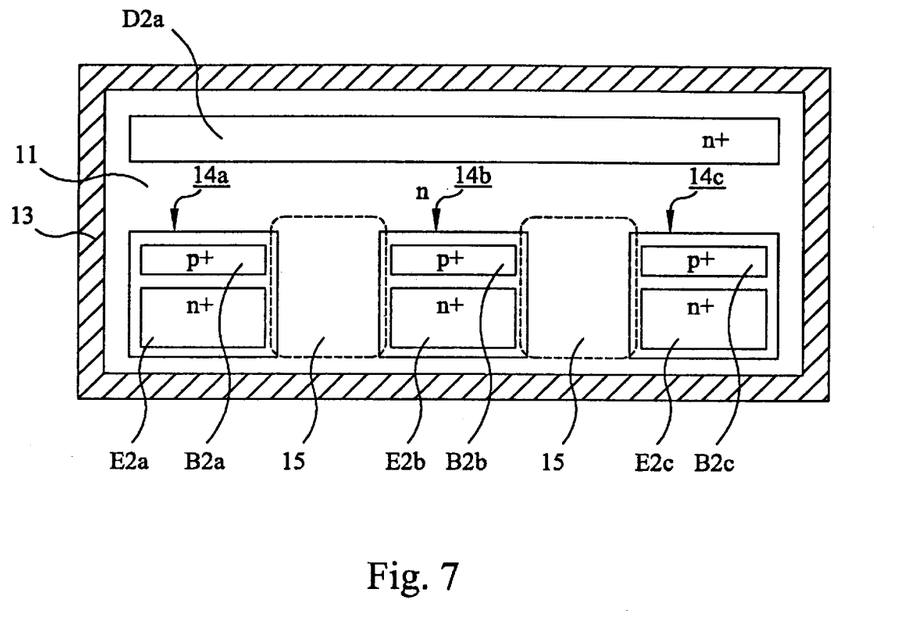
FIG. 7 shows a view of an alternative embodiment according to the invention.

FIG. 7 shows an alternative embodiment according to the invention, where another base region 14c has been added. In this case the common collector region 15 is divided into two separate regions, which are common to the adjacent base regions.

Another parasitic circuit according to FIGS. 1 and 2 is provided from the new base region 14c but the function of the semiconductor device is not altered. The advantage of adding a base region is that a greater current, and subsequently a greater power, can pass through the semiconductor device and each new base region can be considered a new cell in a modular design.

Figure 8:
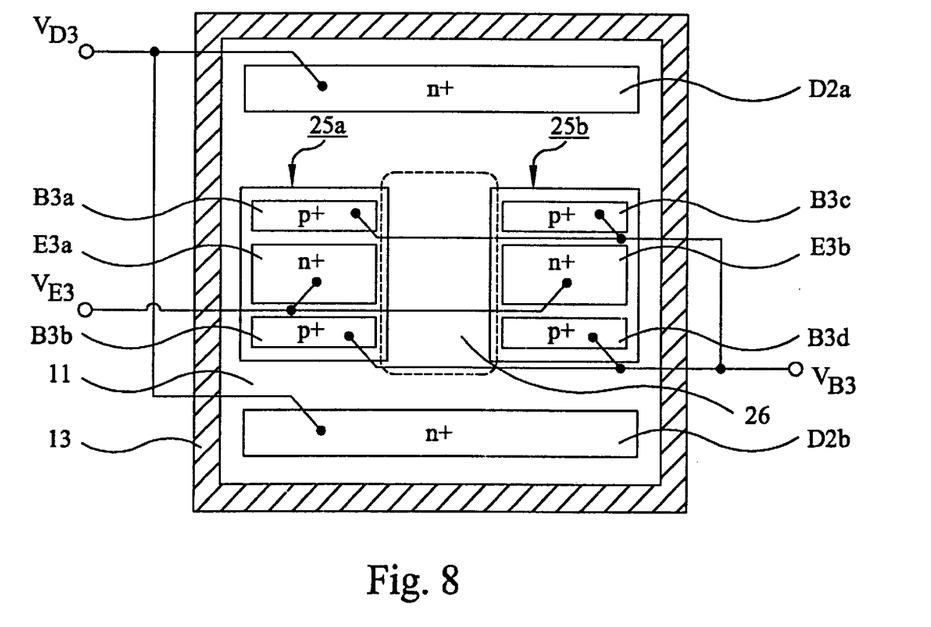
FIG. 8 shows another view with an alternative embodiment according to the invention.

FIG. 8 shows another alternative embodiment according to the invention with a symmetrical alternative of the semiconductor device in FIG. 3, where each base region 25a and 25b comprises two respective base connections B3a, B3b and B3c, B3d, one respective emitter E3a, E3b, and two drain connections D2a and D2b. In each base region 25a, 25b the emitter E3a, E3b is arranged between the base connection regions B3a–B3d, and the base regions are placed side by side in the compo-nent region 11, such that none of the base's connection regions or drain regions is arranged between the respective base region's emitters. Each drain region
D2a, D2b is arranged at one side of the base regions 25a and 25b such that only one of the base's connection regions B3a–B3d is arranged between the respective base region's emitter E3a, E3b and each drain region D2a, D2b. The base connections, the emitters and the drain connections are each individually interconnected and connected
to a respective external connection 8, The distance between the base regions is large enough to form a common collector region 26, which can be completely depleted when voltages $V_{D2}$, $V_{B2}$, $V_{E2}$ are applied to the external connections 8.

This embodiment of the invention has a very compact structure making this embodiment the most useful one. Just as previously described, further base regions can be connected to the device to increase the current that can transverse the device thereby increasing the power.

Figure 9A:
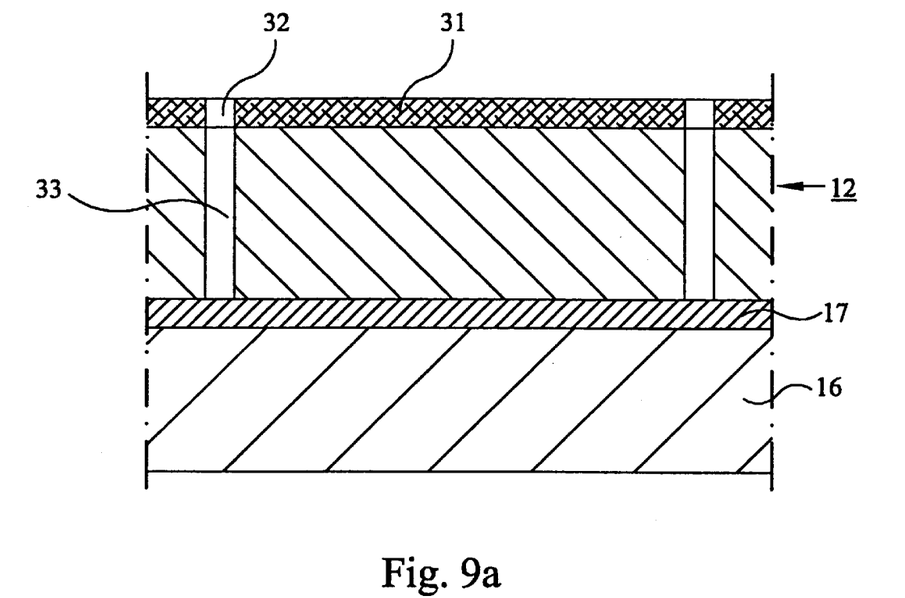
FIGS. 9a–9d show cross-sections of different manufacturing steps for the transistor device of FIG. 3.
Figure 9B:
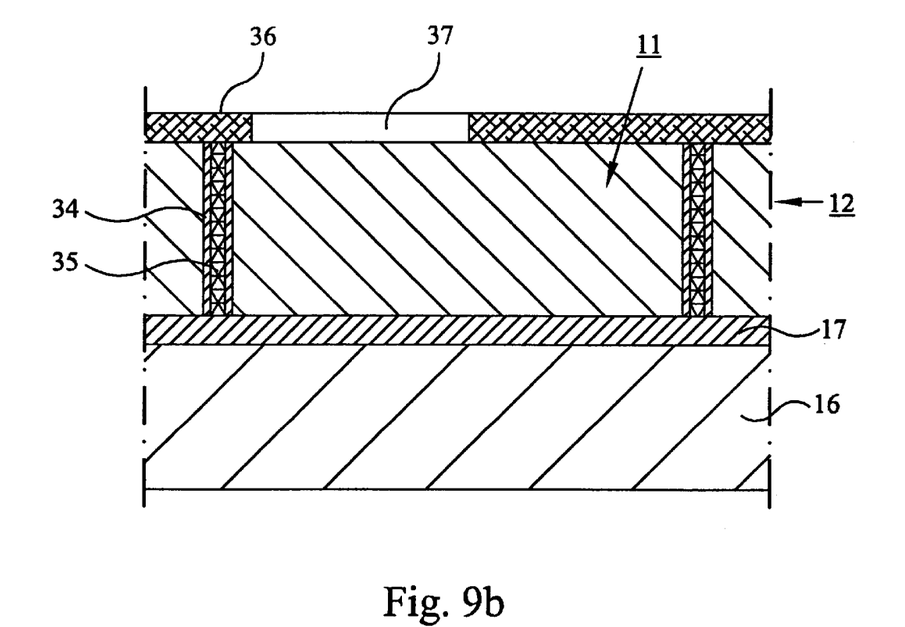
Figure 9C:
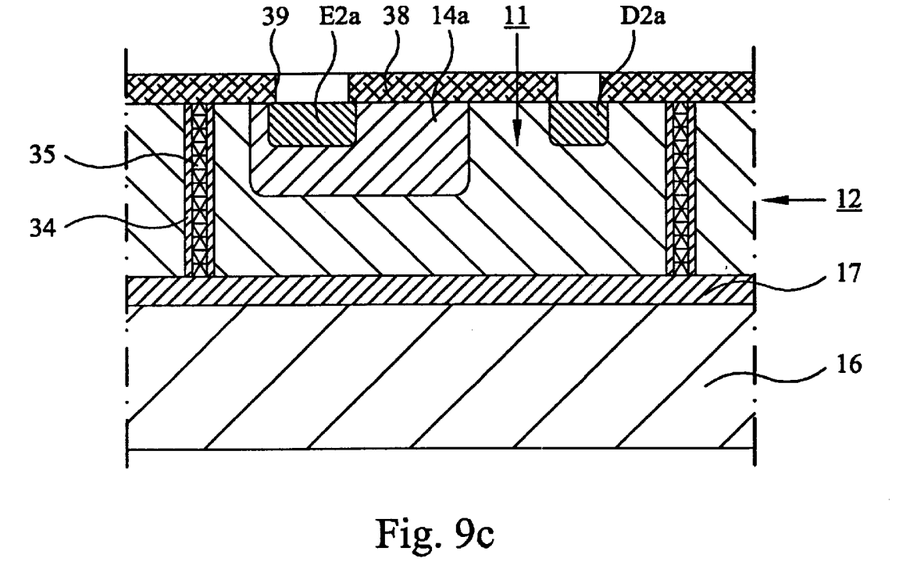

In connection to the FIGS. 9a–9d will shortly be described how the above mentioned components are fabricated. The raw material is a so-called "bonded wafer", comprising the substrate 16 of silicon, the isolating oxide layer 17 and the single-crystal disc 12 as shown in FIG. 9a. Such as bonded wafer can be produced for instance as described in the European patent application cited above EP 0 623 951 A1 and is commercially available. The upper surface of the disc 12 is covered with a photo-resistive layer 31, which is exposed in a predetermined pattern and developed so that openings 32 are created in the layer. Through the openings deep recesses 33 are made by plasma etching down to the isolating layer 17. The sides of the recesses are oxidized into a silicon dioxide layer 34, the rest of the recesses are filled with polycrystalline silicon 35 and the photo-resistive layer 31 is removed as shown in FIG. 9b. The component region 11 is hereby delimited. The disc 12 is covered with a new photo-resistive mask 36 with openings 37. Through these openings a doping is made with positive dopants so that the base regions 14a–14c are provided according to FIG. 9c. The mask 36 is removed and a further photo-resistive mask 38 is attach-cd, which have openings 39 for a negative doping of the emitter E2a–E2c of each base region and the drain connections D2a–D2b. The mask 38 is removed and using a new photo-resistive mask the strong positive doping of the base connections B2a–B2d is made.

Figure 9D:
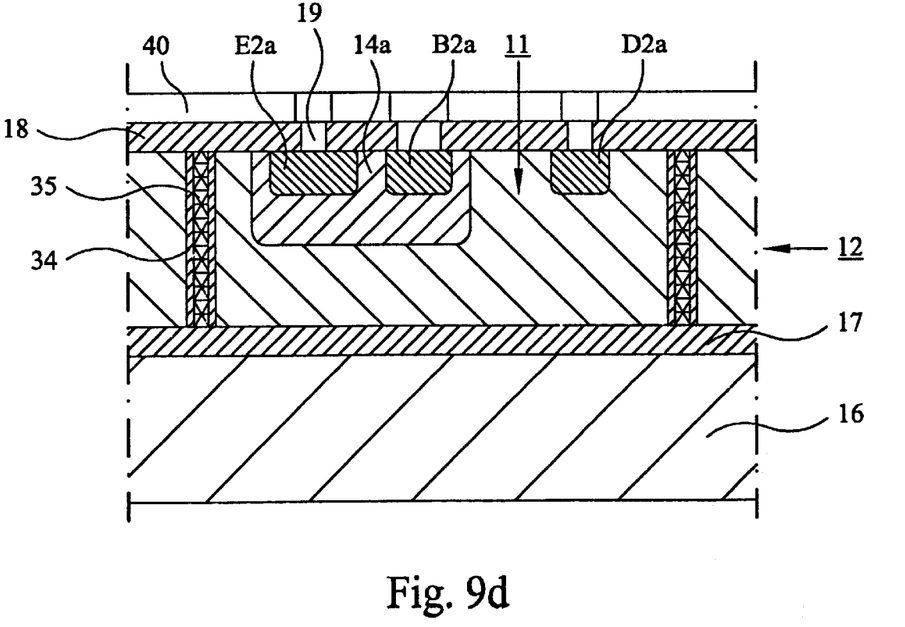

This manufacturing stop is not shown in the figure. The later photo-resistive mask is removed and the surface of the disc 12 is oxidized into the isolating silicon dioxide layer 18 as shown in FIG. 9d. This layer 18 is covered with a mask 40 which has openings 41, through which the connection openings 19 are etched in the layer 18. The mask 40 is removed and the component is provided with external connections and protective layers, which is not shown in the figures.

The lateral bipolar transistor LBIP with associated transistors according to FIG. 3 has been described above. Further base regions 14 with associated emitter E2 and base connections B2 can be added by the addition of openings in the mask layers 36, 38 and 40 mentioned above.

Figure 10:
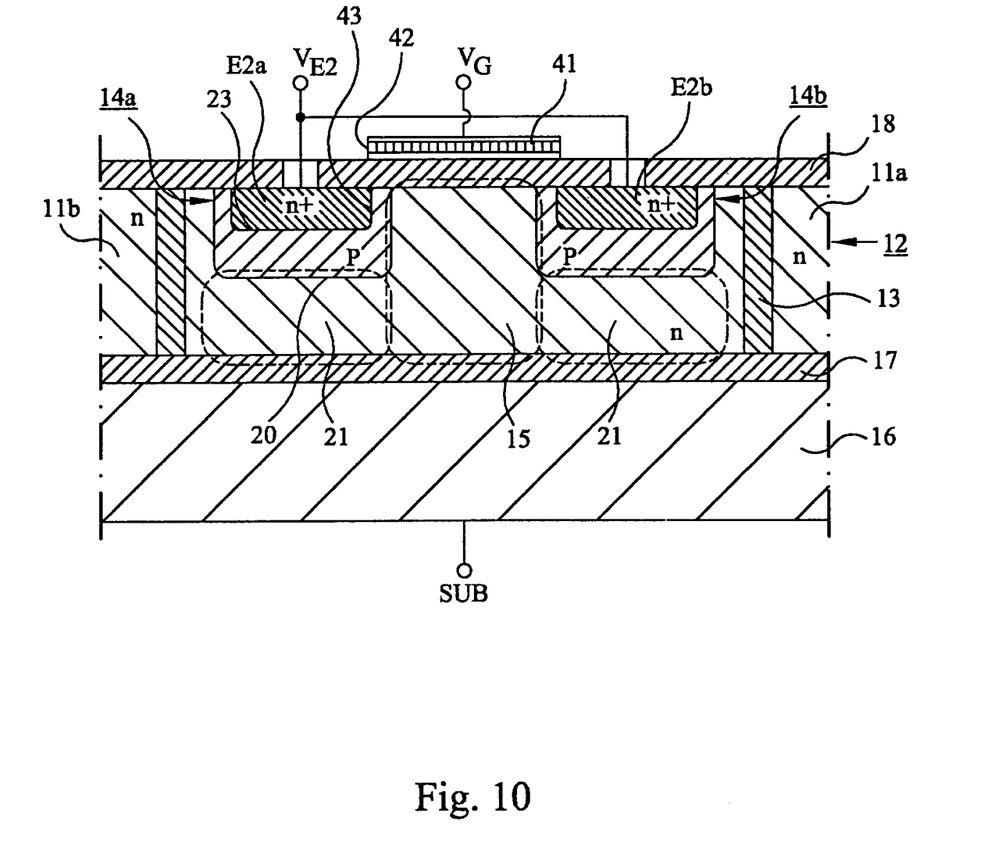
FIG. 10 shows a cross-section of a lateral bipolar transistor according to FIG. 3 with a device for increasing the gain and a possibility of changing the operating mode of the transistor.

FIG. 10 shows an alternative embodiment of the invention comprising a gate 41 arranged on the isolating silicon dioxide layer 18 and between the base regions 14a and 14b. The gate 41 overlaps a part of both base regions so that the edge 42 of the gate is aligned with the delimiting surface 43 of the emitter nearest the common collector region 15. The gate is connected to an external electrical connection 8 or is alternatively connected to the base connections B2a, B2b of the semiconductor device.

By adding the gate, of e.g. poly-crystalline silicon, two functions are achieved. A first function is a possibility of modulation of the base, between the emitter E2a, E2b and the common collector region 15. A second function is a possibility of modulating the charge of the common collector region 15.

The first function causes two effects, a first effect being a modulation of the gain within a range of gain of 0–10000. A normal bipolar transistor operates at a gain of about 100. A second effect is a change of operating mode of the semiconductor device, where the bipolar characteristic changes into a MOS-characteristic. This transition is determined by the base voltage threshold in relation to an applied voltage on the gate.

The second function causes an effect where the semiconductor device obtains a low on-resistance in both operating modes.

Figure 11:
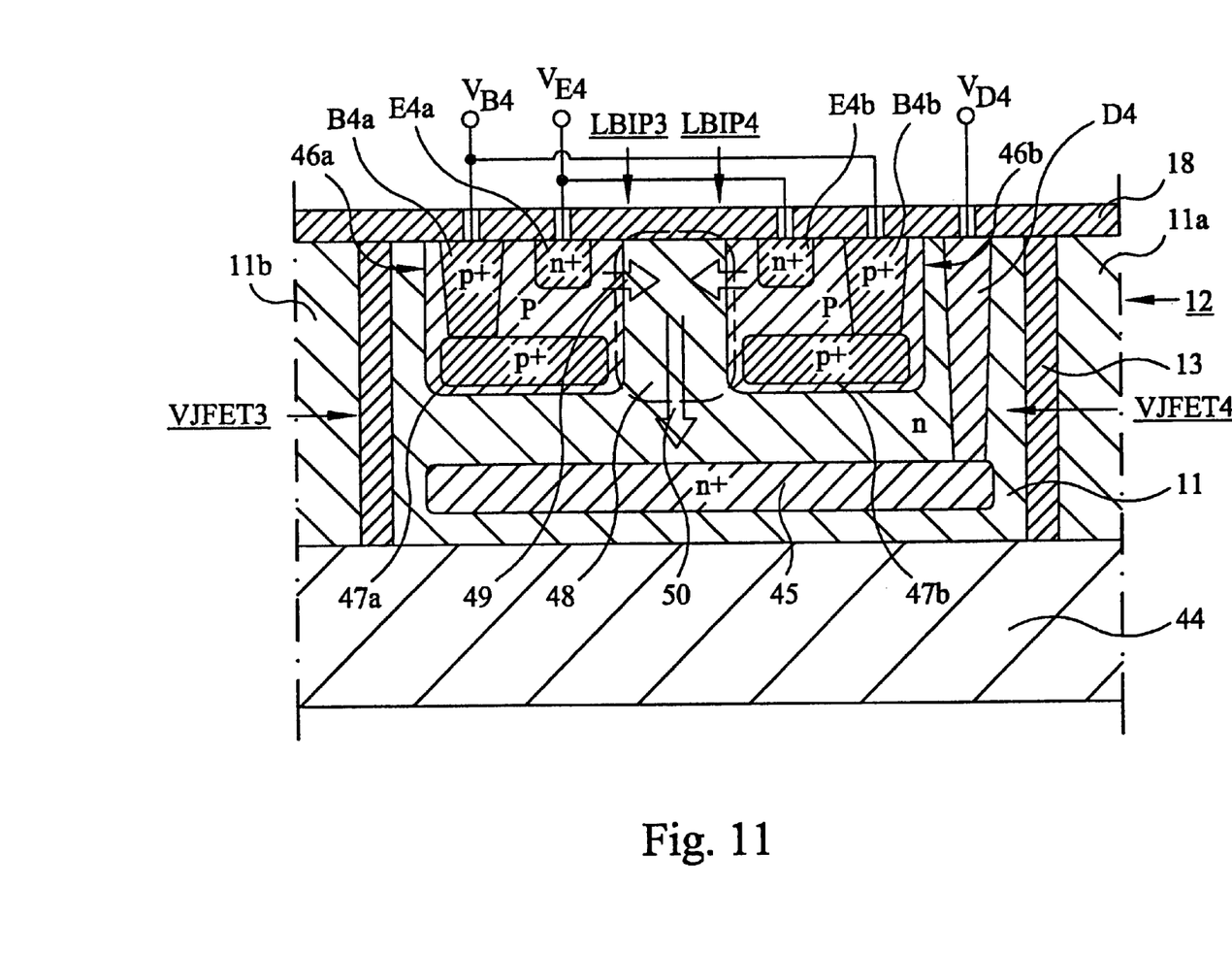
FIG. 11 shows a cross-section of a bipolar transistor, partially operating in lateral extension.

FIG. 11 shows across section of a further alternative embodiment of a semiconductor device, partly operating in lateral extension. The single-crystal disc 12 constitutes the active layer of the semiconductor device. In the single-crystal disc, the component region 11 is delimited from the surrounding parts 11a and 11b by the separa-tion layer 13 as previously described. The separation layer extends from the surface of the single-crystal disc down to a layer 44 below. The layer below can for instance comprise an isolating layer or a semiconducting material.

The semiconductor device comprises two lateral bipolar transistors LBIP3 and LBIP4 and two vertical field effect transistors VJFET3 and VJFET4. There is further a number of parasitic circuits which are not shown in the figure. The field effect transistors VJFET3 and VJFET4 have a drain connection D4 connected to a buried drain region 45, which are heavily doped with negative carriers n+. The lateral transistors each have a base region 46a and 46b, which are doped with positive carriers p. Each base region has a base connection B4a and B4b, respectively, with an interconnected buried base 47a and 47b, which are heavily doped with positive carriers p+. There is further in each base region an emitter E4a and E4b, respectively, which are heavily doped with negative carriers n+.

The component region is covered by the isolating layer 18 with openings 19 for the external electrical connections 8. These are connected to the respective base connections B4a and B4b, the emitters E4a and E4b and the drain connection D4. In each base region 46a and 46b the buried base 47a and 47b, respectively, is arranged under the emitter which is recessed into the base region. The base regions are placed side by side in the component region 11, where the base connections B4a and B4b are connected to the respective buried base, so that a common collector region 48 is formed, where the collector K4 of the lateral bipolar transistors coincides with the source S4 of the vertical field effect transistors. The emitters E4a and E4b are placed in the respective base regions so that none of the base connections B4a and B4b of the base regions is arranged between said emitters and the common collector region 48.

The function of this semiconductor device is in principle the same as described in FIG. 5a–5c and in FIG. 6. In the same way the depletion of the common collector region here occurs in two steps. A first step 49 occurs in a direction from the respective base regions into the common collector region 48. When these two depletion regions meet, a combination occurs and the direction is changed and occurs in a second step 50 in the direction from the common collector region 48 to the drain region 45.

The drain connection D4 is not necessary for the semiconductor device to operate, but the buried drain region 45 can extend all the way out to the separation layer 13, which can be designed with a heavily negatively doped edge for connection to the external connection 8.

Another possibility is that the drain region 45 can be connected by the connection of an external electrical contact 8 to the surface of the component region 11. The function, however, is slightly inferior due to a higher resistance between the connection 8 and the buried drain region 45. In the same way the base connections B4a and B4b can be eliminated.

The device in FIG. 11 can naturally be combined with the function described in FIG. 10, wherein a gate is placed on the isolating layer 18 between the emitters of the base regions. The first function, gain modulation and change of operating mode, works in this respect in the same way, but the effect of the second function, low on-resistance, is slightly less because the propagation direction of the depletion region in the second step occurs in a transverse direction to the lateral direction.

The described lateral bipolar transistors LBIP are NPN-transistors but PNP-transistors are obviously also within the scope of the invention.

I claim:

1. A semiconductor device in an active layer with a high breakthrough voltage, said device having at least one depletion region with reduced field strength and comprising:

a component region of semiconductor material with an upper surface in the active layer, said component region having a relatively low concentration of dopant of a first type, an electrically delimiting separation layer extending around the component regions towards the surrounding active layer, in the component region recessed transistor regions for at least one semiconductor component, at least three electrical connections in the component region, wherein the device comprises at least two separated, in the component region recessed based regions with a relatively low concentration of dopant of a second type opposite to the first type of dopant, wherein the recessed base regions extend from said upper surface of the component region, wherein the device comprises a PN-junction at each surface delimiting the recessed base regions from a remaining part of the component region, wherein the device comprises at least one drain connection placed in said remaining part of the component region with a high concentration of dopant of the first type, said drain connection being connection with a first one of the electrical connections, wherein each base region surrounds an emitter region which is heavily doped with the first type of dopant and which is connected to a second one of the electrical connections, and wherein at least one base connection region is arranged in each base region, said base connection region being heavily doped with the second type of dopant and which is connected to a third one of the electrical connections, wherein at least one common collector region extends between the PN-junctions of two adjacent base regions at the upper surface of the component region, said collector region at a predetermined difference in potential between the drain connection and the base connections being completely depleted at least in a lateral extension.

2. The semiconductor device of claim 1, wherein the base regions are located so that the region between the emitter regions of two mutually adjacent base regions is free from base connection and drain connection, and wherein an integrated charge over a lateral distance between one of the emitter regions and the common collector region is less than an integrated charge over a vertical distance from the lower surface of said emitter region to the lower surface of the base region.

3. The semiconductor of claim 1, wherein the active layer has a lower surface bordering a dielectric isolating layer delimiting a lower surface of the component region from a semiconductor substrate and in that the drain connection comprises a recessed region extending from the upper surface of the component region and is arranged beside the base regions so that only one of the base connections in the respective base regions is placed between the emitter region and the drain connection.

4. The semiconductor device of claim 1, wherein the drain connection comprises a buried region which is arranged near the lower surface of the active layer and a subjacent layer, said buried region being arranged below the base regions, the base connection in the respective base regions being arranged below the emitter so that said base connection is placed between the emitter region and the buried region for each base region.

5. The semiconductor device of claim 4, wherein the subjacent layer is a dielectric isolating layer.

6. The semiconductor device of claim 4, wherein the subjacent layer is a semiconductor substrate.

7. A method of operating the semiconductor device with a high breakthrough voltage of claim 1, said method comprising:

applying voltages to the external connections, depletion of the common collector region in a first step in a propagation direction from the PN-junctions between two mutually adjacent base regions and further in lateral direction in a surface region at the upper surface of the component region, and depletion of the common collector region in a second step in a transverse direction to the first propagation direction, said transverse direction extending towards the drain connection.

8. The method of claim 7, wherein the depletion in the second step is executed in a lateral direction in a surface region at the upper surface of the component region.

9. The method of claim 7, wherein the depletion in the second step is executed in a vertical direction from the upper surface of the component region.

* * * * *